(12) United States Patent
Fantoni et al.

(10) Patent No.: US 11,409,031 B2
(45) Date of Patent: Aug. 9, 2022

(54) OPTICAL DEVICE

(71) Applicants: STMicroelectronics (Grenoble 2) SAS, Grenoble (FR); STMicroelectronics (Research & Development) Limited, Marlow (GB)

(72) Inventors: Frederic Fantoni, Grenoble (FR); Arthur Finlay, Edinburgh (GB); Julien Venel, Saint Blaise du Buis (FR); Guilhem Dubois, Grenoble (FR); Marco Antonelli, Edinburgh (GB); Hugo Vargas Llanas, Edinburgh (GB); Antoine Puthon, Voiron (FR)

(73) Assignees: STMicroelectronics (Grenoble 2) SAS, Grenoble (FR); STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 17/188,085

(22) Filed: Mar. 1, 2021

(65) Prior Publication Data

US 2021/0271017 A1    Sep. 2, 2021

(30) Foreign Application Priority Data

Mar. 2, 2020    (FR) .................................. 2002097

(51) Int. Cl.
| | |
|---|---|
| *F21V 8/00* | (2006.01) |
| *F21V 13/02* | (2006.01) |
| *G02B 6/42* | (2006.01) |
| *F21Y 115/10* | (2016.01) |

(52) U.S. Cl.
CPC ............ *G02B 6/0096* (2013.01); *F21V 13/02* (2013.01); *G02B 6/4203* (2013.01); *G02B 6/4204* (2013.01); *G02B 6/4298* (2013.01); *F21Y 2115/10* (2016.08)

(58) Field of Classification Search
CPC .. G02B 6/0096; G02B 6/4203; G02B 6/4204; F21V 13/02
See application file for complete search history.

(56) References Cited

U.S. PATENT DOCUMENTS

| | | | |
|---|---|---|---|
| 5,980,063 | A | 11/1999 | Ford et al. |
| 6,031,958 | A | 2/2000 | McGaffigan |
| 6,208,880 | B1 | 3/2001 | Bentsen et al. |

(Continued)

FOREIGN PATENT DOCUMENTS

| | | |
|---|---|---|
| CN | 204254459 U | 4/2015 |
| GB | 1127126 | 9/1968 |
| TW | 201418737 A | 5/2014 |

OTHER PUBLICATIONS

INPI Search Report and Written Opinion for FR Appl. No. 2002097 dated Nov. 13, 2020 (10 pages).

(Continued)

*Primary Examiner* — Evan P Dzierzynski
(74) *Attorney, Agent, or Firm* — Crowe & Dunlevy

(57) ABSTRACT

An optical device is mounted to an electronic circuit having a main face with at least one light source. The optical device is made from a block which includes, for each light source, a corresponding opening that passes through the block. The opening includes a cylindrical part with a threading on an inside surface.

44 Claims, 3 Drawing Sheets

(56) References Cited

U.S. PATENT DOCUMENTS

| | | | |
|---|---|---|---|
| 2004/0008952 A1* | 1/2004 | Kragl | G02B 6/4212 |
| | | | 385/88 |
| 2006/0070278 A1 | 4/2006 | Kajikuri et al. | |
| 2014/0043845 A1* | 2/2014 | Chen | G02B 6/0068 |
| | | | 362/555 |
| 2015/0212263 A1* | 7/2015 | Tzeng | G02B 6/0096 |
| | | | 362/555 |
| 2016/0053947 A1* | 2/2016 | Patterson | G02B 6/0096 |
| | | | 362/608 |

OTHER PUBLICATIONS

First Office Action and Search Report for family-related TW Appl. No. 110107299, report dated Nov. 19, 2021, 8 pages.

* cited by examiner

OPTICAL DEVICE

PRIORITY CLAIM

This application claims the priority benefit of French Application for Patent No. 2002097, filed on Mar. 2, 2020, the content of which is hereby incorporated by reference in its entirety to the maximum extent allowable by law.

TECHNICAL FIELD

The present disclosure relates generally to optical devices and, more particularly, to an optical device intended to be associated with an electronic circuit comprising at least one light source emitting light, which then passes through the optical device.

BACKGROUND

Depending on the application, the light emitted by an electronic circuit comprising at least one light source has to be shaped and/or modified, for example to be collimated and/or spatially uniform and/or spectrally uniform. For this purpose, the circuit is generally associated with an optical device configured to shape and/or modify the light emitted by the circuit when the light passes through the optical device.

An example of such an optical device is intended to provide a collimated light beam which is spatially uniform. In other words, all the rays of beam are substantially parallel to each other (collimated light), and, in a cross section perpendicular to a propagation direction of the beam, the irradiance is substantially the same at each point of the cross section (spatially uniform light). Such a light beam is, for example, used to illuminate a die, for example a die of a plurality of dies of a semiconductor wafer, in order to test functionalities of the die.

However, known optical devices, for example known optical devices for providing a collimated and spatially uniform light beam, generally comprise several lenses and/or mirrors. These known optical devices are thus complex to fabricate and/or expensive and/or bulky and/or complex to optically align with the circuit comprising the light source(s).

There is accordingly a need in the art for improving at least some aspects of known optical devices of the type described above, for example of known optical devices for providing a collimated and/or spatially uniform beam.

There is a need in the art to address all or some of the drawbacks of known optical devices of the type described above, for example of known optical devices for providing a collimated and/or spatially uniform beam.

SUMMARY

In an embodiment, an optical device intended to be mounted with an electronic circuit has a main face comprising at least one light source, a block of the device comprising, for each of said at least one light source, a corresponding opening passing through said block and having a cylindrical part with a threading on an inside surface.

According to an embodiment, each opening extends longitudinally from a first face of said block to a second face of said block opposite the first face, the cylindrical part of said opening extending from the second face along at least a part of a length of said opening, and the opening being configured, on the side of the first face, to be closed by the main face such that the light source corresponding to the opening is facing said opening when the device is mounted with the circuit.

According to an embodiment, the threading extends from the second face.

According to an embodiment, the threading of the cylindrical part of said opening is configured such that, when the device is mounted with the circuit and when the corresponding source light is emitting light, a light beam output from the opening at the level of the second face is spatially uniform and collimated.

According to an embodiment, the threading of the cylindrical part is made of, or is coated with, a non-reflective material.

According to an embodiment, all the inside surface of the cylindrical part is threaded.

According to an embodiment, the optical device comprises, for each opening, a cylindrical pipe arranged inside the block and having an internal volume corresponding to said cylindrical part of the opening.

According to an embodiment, the pipe is made of an opaque material, in particular black anodized aluminum.

According to an embodiment: the pipe comprises an external ring; and the block comprises a stack of a first plate and a second plate, a first part of the pipe extending from the external ring to an end of the pipe being adjusted inside a hole passing through the first plate, and a second part of the pipe extending form the external ring to another end of the pipe being adjusted inside a hole passing through the second plate.

According to an embodiment, the cylindrical part extends all along the length of the opening.

According to an embodiment, the opening comprises a further part extending from the cylindrical part to the main face of the circuit when the optical device is mounted with the circuit, said further part being aligned with the cylindrical part, said further part being preferably cylindrical.

According to an embodiment, the block further comprises a third plate stacked on the second plate, said further part extending from one to the other of two opposite faces of said third plate.

According to an embodiment, said further part has a transversal section larger than a transversal section of the cylindrical part.

According to an embodiment, all of an inside surface of said further part is threaded, and is preferably made of a non-reflective material.

Another embodiment provides an assembly comprising: the optical device; and a circuit having a main face comprising at least one light source, the circuit being mounted with the optical device such that, each of said at least one light source faces a corresponding opening of the optical device, said corresponding opening being closed by the main face of the circuit on the side of said circuit.

According to an embodiment, at least a light source among said at least one light source comprises a plurality of light emitting elements each configured to emit light in a different range of wavelengths, the plurality of light emitting elements being preferably a plurality of light emitting diodes.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 1 is a schematic section view which illustrates an embodiment of an assembly comprising an circuit with light sources and an optical device according to an embodiment.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, usual circuits comprising at least one light source and intended to be associated with an optical device have not been described in details, the described embodiments being compatible with such circuits. Furthermore, usual applications in which an association of an circuit comprising at least one light source and of an optical device configured to shape and/or modify the light emitted by circuit is used have not been described in details, the described embodiments being compatible with such usual applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, unless specified otherwise, a material is non-reflective for a given range of wavelengths if, when a ray of light having wavelengths in this range reaches a 100 μm thick layer of this material, only 10% or less of the light power of the ray is reflected by the layer. In the following description, a material is said to be non-reflective for example if this material is non-reflective for a range of wavelengths which extends from 200 nm to 2000 nm.

Figure 1:
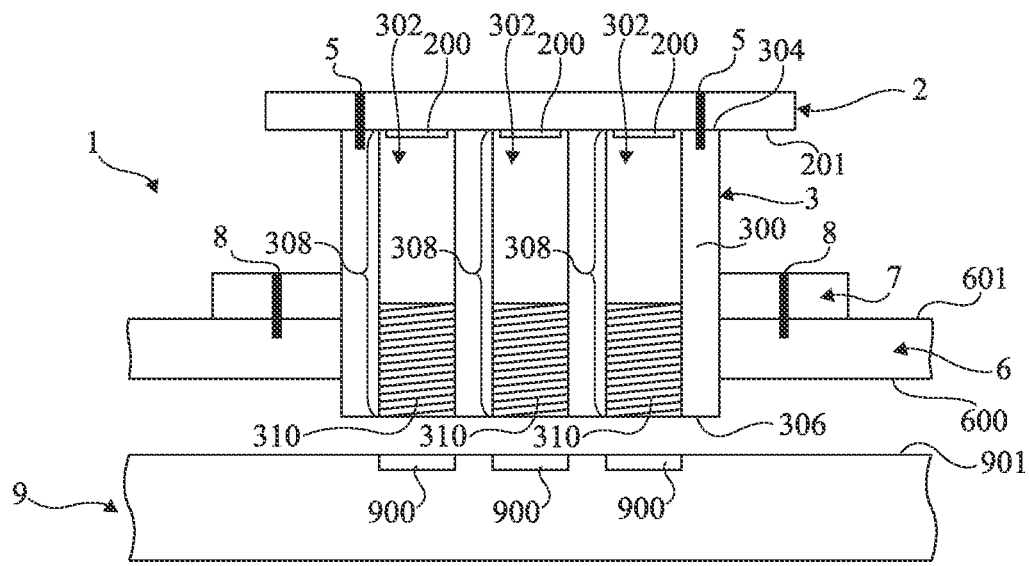

FIG. 1 is a schematic section view which illustrates an embodiment of an assembly 1 comprising a circuit 2 with light sources 200 and an optical device 3 according to an embodiment.

The circuit 2 comprises a plurality of light sources 200, three light sources 200 being represented in the example of FIG. 1. More particularly, a main face 201 of the circuit 2 (the bottom face in FIG. 1) comprises the light sources 200. The light sources 200 are, for example, disposed or mounted on the face 201 of the circuit 2 (the bottom face in FIG. 1). For example, the circuit 2 is a printed circuit board (PCB), and each light source 200 for example comprises one or several light emitting diodes (LED), each LED (including a possible packaging of the LED) being, for example, soldered on the main face 201 of the printed circuit board. Preferably, the main face 201 of the circuit 2 is substantially planar, for example planar, which facilitates assembly of the circuit 2 with the optical device 3.

The light sources 200 are, for example, arranged to form a lighting panel. The light sources 200 are, for example, arranged in lines and in columns. The light sources 200 are, for example, identical to each other. The light sources 200 are, for example, configured to emit light having wavelengths in the range from 200 nm to 2000 nm. Each light source 200, for example, has a surface comprised between 15 mm*15 mm and 1 μm*1 μm, the surface of a light source 200 being, for example, measured in a plane parallel to the face 201 of the circuit 2. For example, each light source 200 has a surface equal or substantially equal to 1.5 mm*1.5 mm when the light source is, for example, a light emitting diode. As another example, each light source 200 has a surface equal or substantially equal to 1 μm*1 μm when the light source is, for example, a Vertical-Cavity Surface Emitting Laser (VCSEL).

According to an embodiment, at least some of the light sources 200, for example all the light sources 200, each comprise only one light emitting element, for example one light emitting diode.

According to another embodiment, at least some of the light sources 200, for example all the light sources 200, each comprise more than one light emitting element, for example a plurality of light emitting diodes.

According to an embodiment, each light emitting element of the plurality of light emitting elements of a given light source 200 is configured to emit light in a different range of wavelengths. Thus, this light source 200 emits light in a range of wavelengths wider than the one which could be emitted by a single light emitting element.

The optical device 3 comprises a block 300. In the embodiment of FIG. 1, the block 300 is, for example, made of a single piece made of the same material, preferably a non-reflective material for the wavelength range of the light sources 200, as a unitary or integral body. As an example, the block 300 is made of aluminum, preferably black anodized aluminum or, said otherwise, aluminum with a non-reflective coating for the wavelength range of the light sources 200. As another example, the block 300 is made of a nickel (Ni) cobalt (Co) ferrous (Fe) alloy, or FeNiCo alloy, for example an FeNiCo alloy comprising 53.5 mass percent of Fe, 29 mass percent of Ni, and 17 mass percent of Co, for example an FeNiCo alloy designated by the commercial trademark Kovar.

For each light source 200 of the circuit 2, the block 300 comprises a corresponding opening 302. Each opening 302 extends longitudinally (vertically in FIG. 1) from a face 304 of the block 300 (the top face in FIG. 1), to a face 306 of the block 300 (the bottom face in FIG. 1), the face 304 and 306 being opposite to each other. Preferably, the face 304 and/or the face 306 are planar or substantially planar, a planar face 304 facilitating assembly of the device 3 with the circuit 2. Preferably, faces 304 and 306 are parallel or substantially parallel to each other. As an example, the block 200 has the shape of a cube, a rectangular parallelepiped, or a cylinder.

The device 3 is intended to be mounted with the circuit 2, by putting in contact at least part of face 201 of the circuit 2 with at least part of face 304 of block 300, preferably by putting in contact the entire face 304 of the block 300 with a corresponding part of the face 201 of the circuit 2. When the device 3 is mounted or assembled with the circuit 2, the device 3 and the circuit 2 are rigidly fixed to each other, for example by means of fixation such as that, for example, using screws 5.

On the side of the face 304, or, said otherwise, at the level of the face 304, each opening 302 is configured to be closed, or sealed, by the face 201 of the circuit 2 when the circuit 2 is mounted with the device 3. Said otherwise, for each opening 302, a portion of the face 304 extending from the opening 302 and entirely surrounding the opening 302 is configured to be entirely in contact with a corresponding portion of the face 201 when the circuit 2 is mounted with the device 3.

Furthermore, on the side of the face 304, each opening 302 is configured such that the light source 200 corresponding to the opening 302 is entirely facing the opening 302 when the circuit 2 is mounted with the device 3. Said otherwise, when the circuit 2 is mounted with the device 3, for each couple of a light source 200 and a corresponding opening 302, the light source 200 is entirely facing its corresponding opening 302. For example, when the light source 200 is disposed on the face 201 of the circuit 2, the light source 200 is entirely surrounded by a wall of the opening 302, that is to say the inside surface of the opening 302.

Such configuration of each opening 302 at the side of face 304 allows avoiding to any light, except from that emitted by the corresponding light source 200, to enter into the opening 302 on the side of the face 304.

Each opening 302 comprises a cylindrical part 308 which extends from the face 306, along at least a part of a length of the opening 302. For example, in FIG. 1, the cylindrical part 308 of each opening 300 extends on all the length of the opening 302.

Each opening 302 comprises a threading 310 on an inside surface of its cylindrical part 308. Said otherwise, the inside surface of the cylindrical part 308 is threaded on at least a part of its length, preferably along all its length. For example, in FIG. 1, the threading 310 of each opening extends only on a part of the length of the cylindrical part 308, and more particularly on a part of the length of the cylindrical part 308 which is on the side of the face 306. The threading 310 can be any helicoidal pattern formed on at least a part of the cylindrical part 308 of an opening 302, for example by tapping.

The inventors have noted that the threading 310 of an opening 302 enhances the spatial uniformity of the light beam output from the opening 302 at the level of face 306. Indeed, when a light beam emitted by a light source 200 passes through the corresponding opening 302, a part of the light beam is reflected on the inside surface of the opening 302. When the light is reflected on an unthreaded surface, this reflection is a specular reflection. The light reflected by specular reflection which is output from the opening 302 could lead to spatial non-uniformities. When the light is reflected on a threaded surface, this reflection is a diffuse reflection. The light reflected by diffuse reflection which is output from the opening 302 does not introduce spatial non-uniformities. Said otherwise, the part of the emitted light which could experience a specular reflection on the wall of the opening 200 and introduce spatial non-uniformity in the outputted light is strongly influenced by the threading 310. The influence of the part of the beam which experiences diffuse reflection on the outputted beam is further reduced when the threading 310 is made of a non-reflective material.

Furthermore, the inventors have noted that the device 3 allows to achieve, for each opening 302, a collimated light beam output from the opening 302 at the level of face 306.

Thus, according to an embodiment, the threading 310 of each opening 302 is configured such that, when the device 3 is mounted with the circuit 2 and when the light source 200 facing an opening 302 is emitting light, a light beam output from the opening 302 at the level of the face 306 is spatially uniform.

According to an embodiment, a diameter and a length of each opening 302, and the threading of the opening 302 are configured such that, when the device 3 is mounted with the circuit 2 and when the source light 200 facing the opening 302 is emitting light, a light beam output from the opening 302 at the level of the face 306 is collimated. More particularly, in such embodiment, the diameter of the collimated light beam output from the opening 302 is equal or substantially equal to the one of the opening 302 at the level of face 306. Thus, the diameter of the opening 302 at the level of face 306 is adapted, or modified, based on an expected value of the diameter of the collimated light beam.

According to an embodiment, the threading 310 of each opening 302 extends from the face 306. Thus, there is no unthreaded portion on the inside surface of the cylindrical part 308 which extends from the face 306 to the threading 310, on which specular reflections could occur and lead to a spatial non-uniformity in the light beam output from the opening 302 on the face 306 side and/or to non-collimated light beam output from the opening 302 on the face 306 side.

As an example, each opening 302 is made by drilling a hole passing through the block 300, between faces 304 and 306, at the location of opening 302, and by tapping at least part of the hole to make the threading 310. Thus, the device 3 is particularly simple and inexpensive to fabricate. Furthermore, the diameter of the openings 302 can be small, for example less than 5 mm, for example equal to 3 mm or less.

Rather than providing a threading 310 in each opening 302, as an alternative a rough surface could instead be provided, for example made by a mechanical, an electro-mechanical or a chemical treatment, or even by film coating. However, such treatments or coating are very difficult to be applied inside small volumes, for example openings 302 with a diameter less than 5 mm, with good reproducibility and uniformity.

Rather than providing a threading 310 in each opening 302, as an alternative the opening 302 could be provided with an inside surface coated with a non-reflective coating, typically a black coating, without the threading. However, such coatings are very difficult to be applied inside small volumes, for example openings 302 with a diameter less than 5 mm, with good reproducibility and uniformity. Moreover, such coatings are expensive, and their efficiency depend on the wavelength and the incidence angle of the light ray reaching the coating. In particular, a black coating generally reflects a larger amount of light closer to grazing incidence, for example a light ray having an angle of incidence (between the normal to the coating and the direction of the incident light ray) more than 80°. This increasing reflectance has a specular nature rather than a diffuse nature.

Furthermore, the inventors have noted that a beam output from an opening 302 at the face 306 side has the same spectrum as the spectrum of the light emitted by the light source 200. Said otherwise, the light beam output from the opening 302 is spectrally uniform relative to the light source. In particular, when the light propagates through the opening 302, no new wavelength is introduced in the spectrum of the light and the modification of the intensity of the light is not dependant on the wavelengths of the light.

Referring again to FIG. 1, in this example, the assembly 1 of the circuit 2 and the optical device 3 is part of a probe card, or test card.

The assembly 1 is, for example, mounted with a printed circuit board 6, the device 3, for example, passes through a hole arranged in the printed circuit board 6. The assembly 1 and the board 6 are rigidly fixed to each other, for example by fixation means not shown on FIG. 1. For example, the face 306 of the block 300 is at a lower level than that of a face 600 of the printed circuit board 6. Although this is not shown on FIG. 1, electrical and/or optical probes are generally mounted with the board 6, such electrical and/or optical probes being configured to be respectively electrically and/or optically coupled to corresponding inputs and/or outputs of devices under test which are illuminated with the assembly 1.

In the example of FIG. 1, a stiffener 7 is mounted with the printed circuit board 6, on a face 601 of the board 6 opposite face 600. The stiffener 7 and the board 6 are mounted with each other such that a hole arranged in the stiffener is aligned with the hole arranged in the printed circuit board 6. The device 3 passes through these aligned holes, or, said otherwise, the device 3 is adjusted in these aligned holes. The stiffener 7 and the board 6 are rigidly fixed to each other, for example by fixation means such that for example screws 8.

In the example of FIG. 1, the assembly 1, and more generally the probe card comprising the assembly 1, is used to simultaneously illuminate a plurality of dies 900 of a semiconductor wafer 9. For this purpose, the face 306 of device 3 is facing a face 901 of the wafer 9, the dies 900 being located on the side of the face 901. In this example, the repartition of the openings 302 relative to each other is the same than the repartition of the dies 900 relative to each other. As a result, each die 900 receives the light emitted by a given light source 200. Moreover, the diameter of the openings 302 at the face 306 side is configured such that the light beams output from these openings 302 illuminate entirely a corresponding die 900 of the wafer 9.

Figure 2:
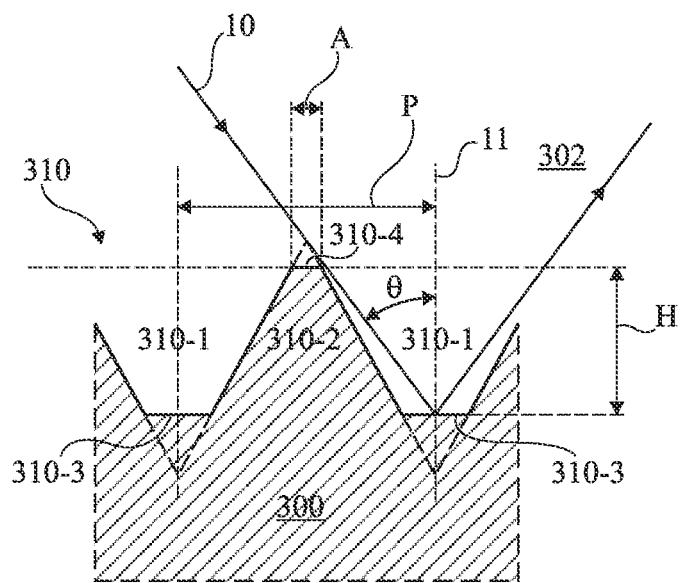
FIG. 2 is a schematic section view of a part of the optical device of FIG. 1 according to an example embodiment.

FIG. 2 is a schematic section view of a part of the optical device 3 of FIG. 1 according to an example embodiment. More particularly, FIG. 2 represents a section view of a part of a threading 310 of an opening 302, this view being taken in a plane including an axis of revolution of the cylindrical part 308 of the opening 302. In this example embodiment, the threading 310 is of type commonly named ISO ("International Organization for Standardization") standard.

The threading 310 comprises a succession of periodic recesses 310-1 at a pitch P, or, said otherwise a succession of periodic reliefs 310-2 at the pitch P, each relief 30-2 having here a shape similar to the one of the recesses 310-1. In this example, each recess 310-1 has the shape of a triangle, the tip of which being truncated, and each relief 310-2 has the shape of a triangle, the tip of which being truncated. Thus, there is, in the view of FIG. 2, a planar surface, or plateau, 310-3 at the bottom of each recess 310-1, and a planar surface, or plateau, 310-4 at the top of each relief 310-2. The length A of each surface 310-4 between two successive recesses 310-1 is preferably as small as possible to reduce the proportion of emitted light rays that could be reflected by specular reflection on these surfaces 310-4.

Without the threading 310, the inside surface of the opening 302 would correspond to a cylindrical surface including all the surfaces 310-4. An incident light ray 10 which would reach this unthreaded surface, at a location comprised between the location of two successive surfaces 310-4, would be reflected by specular reflection. However, an incident light ray 10 which reaches the threading 310 at a location comprises between two successive surfaces 310-4 can be reflected by specular reflection on the surface 310-3 between these two successive surfaces 310-4 only if its angle of incidence θ, measured between the normal 11 to this surface 310-3 and the direction of propagation of the ray 10, is less than a maximal angle θmax defined by the following equation:

$$\mathrm{Cotan}(\theta max)=2*H/(P-A),$$

where H is the height between a plan comprising the surfaces 310-3 and a plan comprising the surfaces 310-4 (in the view of FIG. 2), and Cotan is the cotangent function.

The threading 310 thus allows to reduce the specular reflection of light rays having grazing incidence, that is to say, in this example, light ray having an angle θ of incidence greater than θmax. It can note that increasing the height H of the threading 310 and/or reducing the pitch P allows for suppressing more specular reflections of light rays with a grazing incidence.

Furthermore, we consider an incident light ray reaching an inclined face of a relief 310-4, which is on the side of the light source 200 (not shown on FIG. 2), thus the inclined face which is on the left on the example of FIG. 2. This ray will be reflected toward the light source 200. As a result, this light ray will not generate spatial non-uniformity in the light beam output from the opening 302 on the side of the face 306 (not shown on FIG. 2), which is on the right on the example of FIG. 2.

Although the operation of the threading 310 has been described for a threading of the type ISO standard, those skilled in the art are capable of adapting this operation to any type of threading, for example to threading of the type commonly named Unified Thread Standard (UTS), National pipe thread (NPT), British Standard Whitworth (BSW), British standard pipe thread (BSP), Acme, Square or Buttress, and more generally to any type of helicoidal reliefs.

Figure 3:
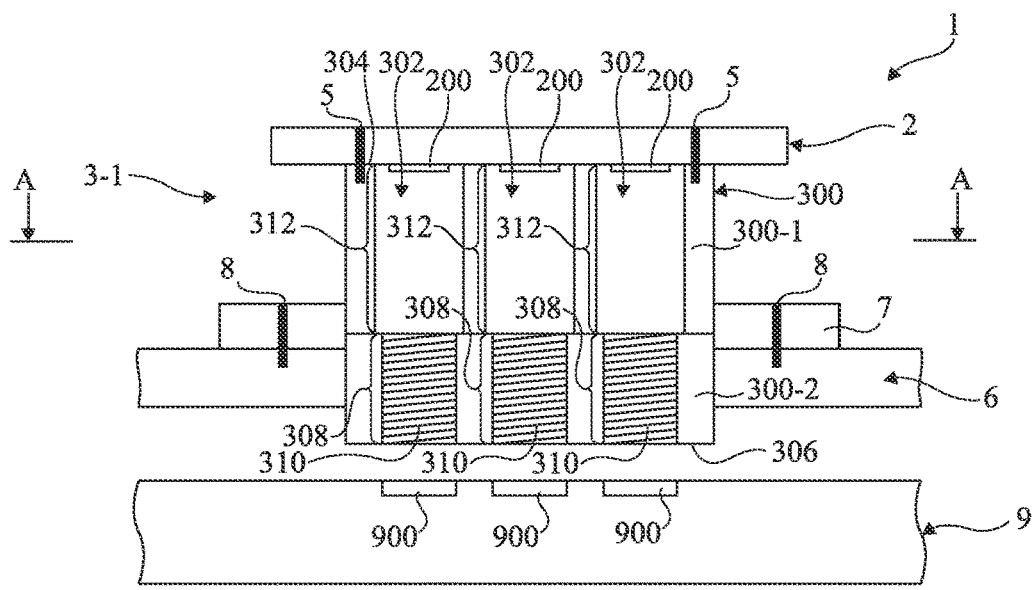
FIG. 3 is a schematic section view which illustrates the assembly of FIG. 1 comprising an optical device according to a further embodiment.

FIG. 3 is a schematic section view which illustrates the assembly 1 of FIG. 1 comprising an optical device 3-1 according to a further embodiment. Only the differences between the devices 3 and 3-1 are here detailed, the other elements 2, 5, 7, 8 and 9 being for example identical to those described in relation with FIG. 1.

More particularly, the device 3-1 differs from the device 3 in that the cylindrical part 308 of each opening 302 extends only on a part of the length of the opening 302. Thus, each opening 302 comprises a further part 312, which extends from the cylindrical part 308 to the face 304.

The cross section of the part 312 of each opening 302, taken in a plan perpendicular to the axis of revolution of the cylindrical part 308 of the opening 302, or, said otherwise, the transversal section of the part 312, is centered on the axis of revolution of the cylindrical part 308. Said otherwise, the parts 308 and 312 of a given opening 302 are aligned with each other.

The transversal section of the part 312 of each opening 302 may have different shapes.

Figure 4:
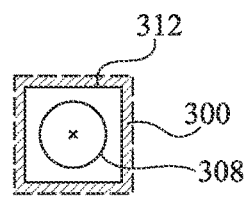
FIG. 4 is a schematic section view of a part of the optical device of FIG. 3 according to an example embodiment.

FIG. 4 is a schematic section view of a part of the optical device 3-1 of FIG. 3 according to an example embodiment. More particularly, the section view of FIG. 4 is taken in a plan AA of FIG. 3, only one opening 302 being represented in FIG. 4.

In the example embodiment of FIG. 4, the transversal section of the part 312 of the opening 302 has the shape of a square.

Furthermore, in the example of FIG. 4, the sides of the square shaped transversal section of part 312 have a length greater than the diameter of the circular shaped transversal section of cylindrical part 308. In other examples not shown, the sides of the square shaped transversal section of part 312 have a length equal to or lower than the diameter of the circular shaped transversal section of cylindrical part 308.

Figure 5:
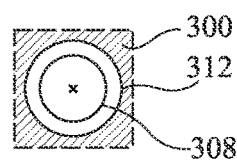
FIG. 5 is a schematic section view of a part of the optical device of FIG. 3 according to a further example embodiment.

FIG. 5 is a schematic section view of a part of the optical device 3-1 of FIG. 3 according to a further example embodiment. More particularly, the section view of FIG. 5 is taken in the plan AA of FIG. 3, only one opening 302 being represented in FIG. 5.

In the example embodiment of FIG. 5, the transversal section of the part 312 of the opening 302 has a circular shape. Said otherwise, the part 312 of the opening 302 is a cylindrical.

Furthermore, in the example of FIG. 5, the cylindrical part 312 of the opening 302 has a diameter greater than the cylindrical part 308 of the opening 302. In other examples not shown, the diameter of the part 312 could be equal to the one of part 308, or even lower than the one of part 308.

Referring again to FIG. 3, the part 312 of each opening is preferably cylindrical, the device 3-1 being thus simpler to fabricate.

The transversal section of the part 312 of each opening is configured such that, when mounting the device 3 with the circuit 1, the light source 200 corresponding to the opening 302 is entirely facing the opening. Thus, the provision of two parts 308 and 312 in each opening allows to adapt the opening 302 to both the shape of corresponding the light source 200 and to the shape of an element to be illuminated by the light beam output from the opening 302. Indeed, the transversal section of the part 312 is adapted to the shape or surface of the light source 200, and the transversal section of the part 308 is adapted to the shape or surface of the element to be illuminated, for example a die 900 in the example of the FIG. 3.

Figure 6:
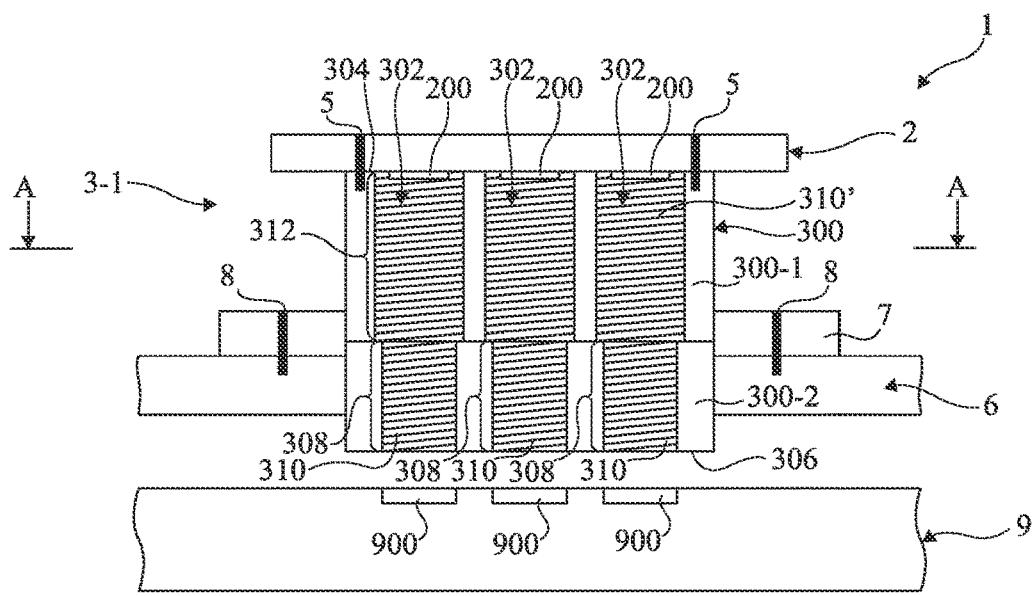
FIG. 6 is a schematic section view which illustrates the assembly of FIG. 1 comprising an optical device according to yet a further embodiment.

In embodiments where the part 312 of each opening 302 is cylindrical, a threading (not shown on FIG. 3) could be provided on the inside surface of the part 312, on at least a part of the length of the part 312. An example of such an embodiment is illustrated by FIG. 6, which is a schematic section view illustrating the assembly of FIG. 1 comprising an optical device according to this example of embodiment. In FIG. 6, the assembly 1 is identical to the assembly 1 of FIG. 3, expect than the part 312 of each opening 302 of the assembly 1 of FIG. 6 comprises a threading 310' along at least a part of its length, preferably along all its length as it is represented in FIG. 6. The pitch and/or the shape of the threading 310' can be different from respectively the pitch and/or the shape of the threading 310.

Referring back to the FIG. 3, in this example, the threading 310 extends on the entire inside surface of the cylindrical part 308, although, in other examples not shown, the threading 310 could extend on a part only of the length of the cylindrical part 308.

In the example of FIG. 3, the block 300 is made by two blocks 300-1 and 300-2, preferably two plates 300-1 and 300-2, which are rigidly fixed to each other, the plate 300-1 resting on the plate 300-2. In this example, the thickness of the plate 300-2 is preferably equal to the length of the part 308 of each opening 302, and the thickness of the plate 300-1 is preferably equal to the length of the part 312 of each opening. Thus, the part 312 of each opening 302 could be made by a simple drilling through the entire thickness of the plate 300-1, and the part 308 of each opening 300-2 could be made by a simple drilling through the entire thickness of the plate 300-2. Then, the threading 310 is made by tapping at least a part of the length of the hole in plate 300-2. Optionally, a threading is made in part 312, by tapping at least a part of the length of the hole in plate 300-1. Finally, the plate 300-1 and 300-2 are mounted with each other.

In other example not shown, the block 300 could be made by a single piece, or by more than two plates 300-1, 300-2 mounted with each other.

Figure 7:
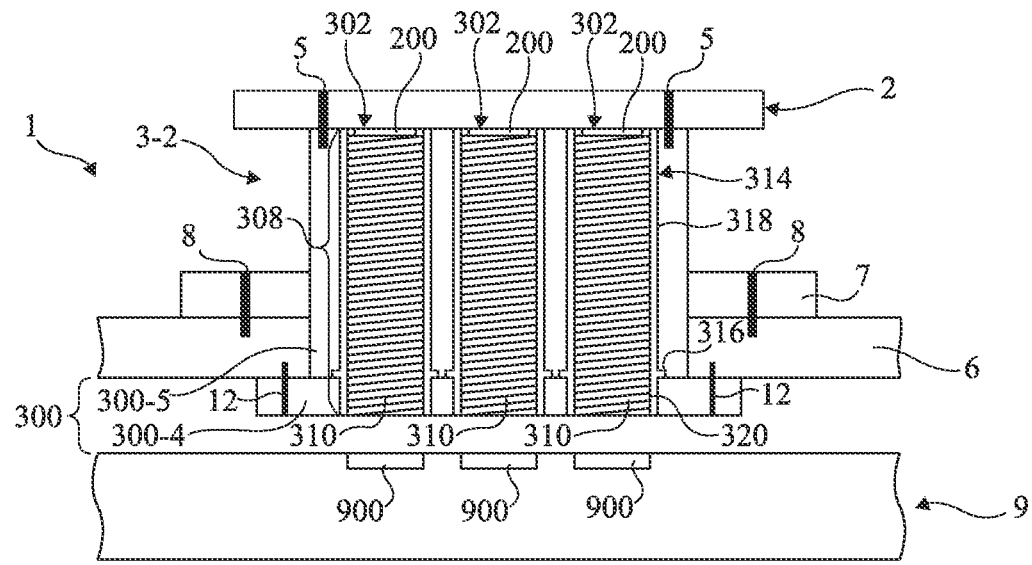
FIG. 7 is a schematic section view which illustrates the assembly of FIG. 1 comprising an optical device according to yet a further embodiment.

FIG. 7 is a schematic section view which illustrates the assembly 1 of FIG. 1 comprising an optical device 3-2 according to yet a further embodiment. Only the differences between the devices 3 and 3-2 are here detailed, the other elements 2, 5, 7, 8 and 9 being for example identical to those described in relation with FIG. 1.

More particularly, the device 3-2 differs from the device 3 in that the device 3-2 comprises, for each opening 302, a cylindrical pipe 314 arranged inside the block 300, the cylindrical pipe 314 having an internal volume corresponding to cylindrical part 308 of the opening 302, which here extends on the entire length of the opening 302. In this example, the pipe 314 has a length equal or substantially equal to the thickness of the block 300, measured between the faces 304 and 306. The pipe 314 is adjusted inside a hole passing through the entire thickness of the block 300, from the face 304 to the face 306.

Preferably, as it is represented in FIG. 7, the entire inside surface of the pipe 314 is threaded, or, said otherwise, the threading 310 extends on the entire length of the pipe 314, and thus on the entire length of the part 308 of the opening 302.

The pipe 314 is, for example, made of an opaque material such as black anodized aluminum.

An advantage of using a pipe 314 with the threading 310 rather than directly form the threading 310 in the material of the block is that the pipes 314 can be easily tested, such that only the pipes 314 having the desired shape and/or the desired length and/or the desired threading 310 and/or the desired length of threading 310 are selected to be mounted in the block 300.

According to an embodiment, as it is illustrated by FIG. 7, each pipe 314 comprises an external ring 316 on its outside surface. The external ring 316 is arranged in a plan perpendicular to the axis of the pipe 314. Thus, each pipe 314 comprises a part 318 extending from the external ring 316 to an end of the pipe, a top end in the example of FIG. 7, and a part 320 extending form the external ring 316 to another end of the pipe 314, a bottom end in the example of FIG. 7.

The provision of the external ring 316 facilitates the mounting of the pipe 314 within the block 300 when the block 300 is made of at last two plates, or blocks, stacked on top of each other. Indeed, the ring 316 of each pipe 314 is then disposed at the level of the face of a first plate being in contact with a face of a second plate. Preferably, a recess configured for receiving the ring 316 is arranged at the level of a contact surface between two plates stacked on top of each other.

In the example of FIG. 7, the block 300 comprises a lower plate 300-4, for example made of ceramic material, and an upper plate 300-5, for example made of an alloy of FeNiCo, stacked on top of plate 300-4. The part 320 of each pipe 314 is adjusted inside a hole passing through the plate 300-4, and the part 318 of the pipe 314 is adjusted inside a hole passing through the plate 300-5. The holes in the plate 300-4 are each aligned with a corresponding hole of the plate 300-5. When the pipe 314 comprises the ring 316, this ring is preferably disposed at the interface between plates 300-4 and 300-5.

Furthermore, in the example of FIG. 7, the lower plate 300-4 is preferably larger than the upper plate 300-5 such that the plate 300-4 comprises portions which extend laterally beyond the edges of the plate 300-5. These portions of the plate 300-4, thus the block 300, can be then rigidly fixed to the board 6, for example by fixation means such as, for example, screws 12. In this example, each pipe 314 comprises a ring 316, which preferably rests on the face of plate 300-4 in contact with a corresponding face of the plate 300-5. The recess for receiving the ring 314 is preferably located at the level of this face of the plate 300-5.

Figure 8:
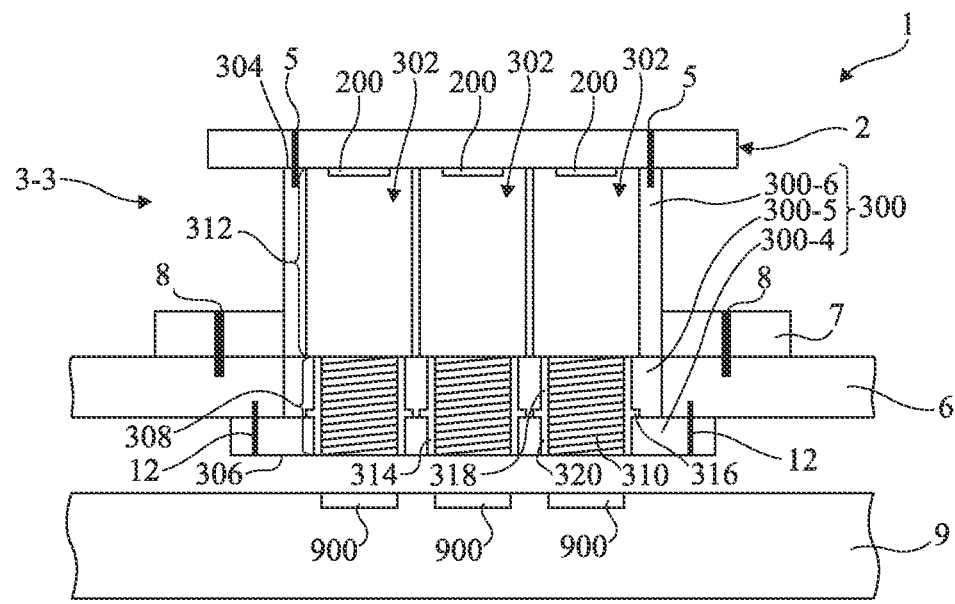
FIG. 8 is a schematic section view which illustrates the assembly of FIG. 1 comprising an optical device according to yet a further embodiment.

FIG. 8 is a schematic section view which illustrates the assembly 1 of FIG. 1 comprising an optical device 3-3 according to yet a further embodiment. The device 3-3 is similar to the device 3-2 described in relation with FIG. 7, only the differences between the devices 3-2 and 3-3 are here detailed, the other elements 2, 5, 7, 8, 9 and 12 being, for example, identical to those described in relation with FIGS. 1 and 6.

More particularly, the device 3-3 differs from the device 3-2 in that part 308 of each opening 302 of the device 3-3, or said otherwise, the pipe 314 of each opening 302, extends only on a part of the length of the opening 302, the opening 302 thus comprising a further part 312 similar to the one described in relation with FIG. 3.

As already described in relation with FIG. 7, in this example, as illustrated by FIG. 8, the block 300 comprises the plate 300-4 and the plate 300-5 stacked on top of the plate 300-4. For each opening 302, the pipe 314 comprises the part 320 which is adjusted in a corresponding hole of the plate 300-4 and the part 318 which is adjusted in a corresponding hole of the plate 300-5. In this example, each pipe 314 comprises a ring 316. In other examples not shown, the ring 316 of each pipe 314 is omitted.

Preferably, the length of the part 320 of each pipe 314 is equal or substantially equal to the thickness of the plate 300-4, and the length of the part 318 of each pipe 314 is equal or substantially equal to the thickness of the plate 300-5. Thus, an end of the pipe 314 flushes with the face of the plate 300-4 opposite the face of the plate 300-4 in contact with the plate 300-5, and the other end of pipe 314 flushes with the face of the plate 300-5 opposite the face of the plate 300-5 in contact with the plate 300-4. Said otherwise, the part 320 of the pipe 314 flushes with the face 306 of the block 300.

Moreover, in this example, the block 300 comprises a further plate 300-6 which is rigidly fixed with the plate 300-5, the plate 300-6 being stacked on the plate 300-5. The part 312 of each opening is located in the plate 300-6 and corresponds to a hole passing through the entire thickness of the plate 300-6.

In the example of FIG. 8, the part 312 of each opening 302 is unthreaded, although in other examples not shown, the part 312 is preferably threaded, preferably on its entire length, as was described previously in relation with FIG. 6.

In the example of FIG. 8, the part 312 of each opening 302 has a transversal section, preferably a circular transversal section, which is larger than the one of part 308 of the opening 302, although in other examples not shown, the part 312 has a transversal section which is equal or smaller than the one of part 318.

As an example, in the embodiments described in relation with FIGS. 1 to 8:

each light source 200 is constituted by more than one light emitting diode and has a surface, in a plane parallel to the face 201, substantially equal to 1.5 mm*1.5 mm;

the light emitted by each light source has wavelengths in the range from 200 nm to 2000 nm;

the length of each opening 302 is substantially equal to 3 cm; and the diameter of the cylindrical part 308 of each opening 302 is equal or substantially equal to 3 mm.

Although, the block 300 has been described as being, for example, made of a single piece in relation with FIG. 1, and as being, for example, made of a stack of at least two plates in relation with FIGS. 3, 4, 5, 6, 7 and 8, those skilled in the art are capable of adapting these examples to cases where the block 300 of FIG. 1 is made with a stack of at least two plates, and where the block 300 of FIGS. 3 to 8 is made by a single piece.

Furthermore, those skilled in the art are capable of modifying the examples of materials indicated for the block 300 and/or for the different plates composing block 300 and/or for the pipes 314, etc.

Those skilled in the art are also capable of modifying the dimensions indicated as example, depending on the target application.

Furthermore, even if the optical devices described above are intended to be mounted with an electronic circuit 2 comprising more than one light source 200, and thus each comprises as much opening 302 as light sources 200, those skilled in the art are capable of adapting these optical devices to the case where the circuit 2 comprises only one light source 200, for example by providing an optical device comprising only one opening 302.

Although the openings 302 are preferably identical to each other, for example when the light sources 200 are identical to each other, those skilled in the art are capable of providing optical devices in which at least two openings 302 are different from each other, for example two openings 302 having cylindrical parts 308 with different diameters.

Various embodiments and variants have been described. Those skilled in the art will understand that certain features of these embodiments can be combined and other variants will readily occur to those skilled in the art. In particular, although the devices 3, 3-1, 3-2 and 3-3 described above allows to get light beams output from the opening 302 at the side of face 306 which are collimated and which are spatially and spectrally uniform, those skilled in the art are capable of modifying the shape and the properties of the light beams outputted by these optical devices. For example, the light beams outputted by the opening could be used as an intermediate light beams of these devices, for example when these devices further comprise an optical diffuser mounted on the face 306 of their block 300, such that the intermediate light beams outputted by the openings 302 then pass through the optical diffuser. As another example, those skilled in the art could provide optical devices 3, 3-1, 3-2 and 3-3 in which one or more lens are mounted inside each opening 302, for example at the level of face 306 of the block 300.

Finally, the practical implementation of the embodiments and variants described herein is within the capabilities of those skilled in the art based on the functional description provided hereinabove. In particular, the materials of the optical device, the dimensions and/or the shape of the openings 302 and/or of the threading 310 of these openings could be chosen by those skilled in the art, for example based on a target application. For this purpose, those skilled in the art could use simulating tool for simulating the operation of the optical device, for example the software LightTools.

The invention claimed is:

1. An optical device, comprising:
a block configured to be mounted to a main face of an electronic circuit which includes at least one light source;
wherein the block comprises, for each light source, a corresponding opening passing through said block;
wherein each opening includes a cylindrical part with a threading on an inside surface of the cylindrical part;
wherein said threading comprises:
a succession of periodic recesses at a pitch P;
a succession of periodic reliefs at the pitch P;
wherein each recess and each relief has a cross-sectional shape of a triangle with a truncated tip.

2. The optical device of claim 1, wherein each opening extends longitudinally from a first face of said block to a second face of said block opposite the first face, wherein the cylindrical part extends from the second face along at least a part of a length of said opening, and wherein the opening is configured, on the side of the first face, to be closed by the main face such that the light source corresponding to the opening is facing said opening when the block is mounted to the electronic circuit.

3. The optical device of claim 2, wherein the threading extends from the second face.

4. The optical device of claim 2, wherein the threading of the cylindrical part of said opening is configured such that, when the block is mounted with the electronic circuit and when the corresponding source light is emitting light, a light beam output from the opening at the level of the second face is spatially uniform and collimated.

5. The optical device of claim 1, wherein the threading of the cylindrical part is made of, or is coated with, a non-reflective material.

6. The optical device of claim 1, wherein all of the inside surface of the cylindrical part is threaded.

7. The optical device of claim 1, wherein the cylindrical part extends all along the length of the opening.

8. The optical device of claim 1, further comprising said electronic circuit having the main face.

9. The optical device of claim 8, wherein said at least one light source comprises a plurality of light emitting elements each configured to emit light in a different range of wavelengths.

10. The optical device of claim 9, wherein the plurality of light emitting elements are a plurality of light emitting diodes.

11. An optical device, comprising:
a block configured to be mounted to a main face of an electronic circuit which includes at least one light source;
wherein the block comprises, for each light source, a corresponding opening passing through said block;
wherein each opening includes a cylindrical part with a threading on an inside surface of the cylindrical part; and
for each opening, a cylindrical pipe arranged inside the block and having an internal volume corresponding to said cylindrical part of the opening.

12. The optical device of claim 11, wherein the cylindrical pipe is made of an opaque material.

13. The optical device of claim 12, wherein the opaque material is black anodized aluminum.

14. The optical device of claim 11, wherein:
the pipe comprises an external ring; and
the block comprises a stack of a first plate and a second plate, a first part of the pipe extending from the external ring to an end of the pipe being adjusted inside a hole passing through the first plate, and a second part of the pipe extending form the external ring to another end of the pipe being adjusted inside a hole passing through the second plate.

15. The optical device of claim 14, wherein the block further comprises a third plate stacked on the second plate, said further part extending from one to the other of two opposite faces of said third plate.

16. The optical device of claim 11, wherein each opening extends longitudinally from a first face of said block to a second face of said block opposite the first face, and wherein the opening is configured, on the side of the first face, to be closed by the main face such that the light source corresponding to the opening is facing said opening when the block is mounted to the electronic circuit.

17. The optical device of claim 16, wherein the threading extends from the second face.

18. The optical device of claim 16, wherein a light beam output from the opening at the level of the second face is spatially uniform and collimated.

19. The optical device of claim 11, wherein all of the inside surface of the cylindrical part is threaded.

20. The optical device of claim 11, further comprising said electronic circuit having the main face.

21. The optical device of claim 20, wherein said at least one light source comprises a plurality of light emitting elements each configured to emit light in a different range of wavelengths.

22. The optical device of claim 21, wherein the plurality of light emitting elements are a plurality of light emitting diodes.

23. An optical device, comprising:
a block configured to be mounted to a main face of an electronic circuit which includes at least one light source;
wherein the block comprises, for each light source, a corresponding opening passing through said block;
wherein each opening includes a cylindrical part with a threading on an inside surface of the cylindrical part and a further part extending from the cylindrical part to the main face of the circuit when the optical device is mounted with the circuit, said further part being aligned with the cylindrical part, said further part being cylindrical.

24. The optical device of claim 23, wherein the block further comprises a third plate stacked on the second plate, said further part extending from one to the other of two opposite faces of said third plate.

25. The optical device of claim 23, wherein said further part has a transversal section larger than a transversal section of the cylindrical part.

26. The optical device of claim 23, wherein all of an inside surface of said further part is threaded, and is made of a non-reflective material.

27. The optical device of claim 23, wherein each opening extends longitudinally from a first face of said block to a second face of said block opposite the first face, wherein the cylindrical part extends from the second face along at least a part of a length of said opening, and wherein the opening is configured, on the side of the first face, to be closed by the main face such that the light source corresponding to the opening is facing said opening when the block is mounted to the electronic circuit.

28. The optical device of claim 27, wherein a light beam output from the opening at the level of the second face is spatially uniform and collimated.

29. The optical device of claim 27, wherein the threading extends from the second face.

30. The optical device of claim 23, wherein the threading of the cylindrical part is made of, or is coated with, a non-reflective material.

31. The optical device of claim 23, further comprising said electronic circuit having the main face.

32. The optical device of claim 31, wherein said at least one light source comprises a plurality of light emitting elements each configured to emit light in a different range of wavelengths.

33. The optical device of claim 32, wherein the plurality of light emitting elements are a plurality of light emitting diodes.

34. The optical device of claim 33, wherein a light beam output from the opening at the level of the second face is spatially uniform and collimated.

35. An optical device, comprising:
a block configured to be mounted to a main face of an electronic circuit which includes at least one light source;
wherein the block comprises, for each light source, a corresponding opening passing through said block;
wherein each opening includes a cylindrical part with a threading on an inside surface of the cylindrical part;
wherein said threading is made of an opaque material.

36. The optical device of claim 35, wherein the opaque material is black anodized aluminum.

37. The optical device of claim 35, wherein the opaque material is a nickel (Ni) cobalt (Co) ferrous (Fe) alloy (FeNiCo).

38. The optical device of claim 35, wherein each opening extends longitudinally from a first face of said block to a second face of said block opposite the first face, wherein the cylindrical part extends from the second face along at least a part of a length of said opening, and wherein the opening is configured, on the side of the first face, to be closed by the main face such that the light source corresponding to the opening is facing said opening when the block is mounted to the electronic circuit.

39. The optical device of claim 38, wherein the threading extends from the second face.

40. The optical device of claim 35, wherein all of the inside surface of the cylindrical part is threaded.

41. The optical device of claim 35, wherein the cylindrical part extends all along the length of the opening.

42. The optical device of claim 35, further comprising said electronic circuit having the main face.

43. The optical device of claim 42, wherein said at least one light source comprises a plurality of light emitting elements each configured to emit light in a different range of wavelengths.

44. The optical device of claim 43, wherein the plurality of light emitting elements are a plurality of light emitting diodes.

* * * * *